March 26, 1968 N. ADAMS ETAL 3,375,416

SEMICONDUCTOR TUNNEL DIODE DEVICE

Original Filed March 16, 1962 2 Sheets-Sheet 1

INVENTORS:
NORBERT ADAMS,
TAPAN MUKERJEE,
JAMES M. SMITH,
BY Robert J. Mooney
THEIR ATTORNEY.

SEMICONDUCTOR TUNNEL DIODE DEVICE

Original Filed March 16, 1962 2 Sheets-Sheet 2

INVENTORS:
NORBERT ADAMS,
TAPAN MUKERJEE,
JAMES M. SMITH,
BY Robert J. Mooney
THEIR ATTORNEY.

United States Patent Office 3,375,416

Patented Mar. 26, 1968

3,375,416

SEMICONDUCTOR TUNNEL DIODE DEVICE

Norbert Adams, Syracuse, Tapan Mukerjee, North Syracuse, and James M. Smith, Liverpool, N.Y., assignors to General Electric Company, a corporation of New York Original application Mar. 16, 1962, Ser. No. 180,164, now Patent No. 3,297,920, dated Jan. 10, 1967. Divided and this application Mar. 14, 1966, Ser. No. 555,659
3 Claims. (Cl. 317—234)

ABSTRACT OF THE DISCLOSURE

Semiconductor tunnel diode consisting of a pellet of first conductivity type semiconductor material sandwiched between two insulating members, with a body of opposite conductivity type inducing activator material supported by one insulating member and fused thereto and to a surface of the semiconductor pellet exposed between the insulating members to form a small area PN junction. Another body of first conductivity type inducing activator material is fused to the second insulating member and to the semiconductor pellet, and respective contacts are connected to the respective bodies of activator material.

The present invention relates generally to semiconductor devices, and particularly to diode devices and methods for fabricating such devices. This is a division of application Ser. No. 180,164, filed Mar. 16, 1962, and now Patent 3,297,920.

The present invention has particular application to diodes made by an alloy process, such as tunnel diodes, backward diodes, zener diodes, varactors and the like. A tunnel diode which is typical of such devices conventionally comprises a body of very low resistivity semiconductor material of one conductivity type into which is alloyed a quantity of suitable activator material to form therein a region of very low resistivity of the opposite conductivity type. The body is usually conductively mounted on a platform and leads connected to the body and alloy material. Usually the junction between the body of one conductivity type and the region of one conductivity is quite small, and accordingly, presents a problem in mechanical support. The prior art structures generally described above leave something to be desired with regard to ruggedness, reliability, ease and cost of fabrication, as well as electrical performance. The present invention is directed to overcoming the shortcomings in such prior art devices and their methods of fabrication.

An object of the preesnt invention is to provide diode devices which are simple in construction and inexpensive to make, yet which are superior over prior art devices in ruggedness, reliability and electrical performance.

Another object of the present invention is to provide a simple, effective and low cost method for forming diodes having very small area junctions, yet which are mechanically strong.

Still another object of the present invention is to provide diodes which do not require separate headers or housings.

A further object of the present invention is to provide diodes having such a highly advantageous electrical characteristics as very low inductance and capacitance, making them suitable for a wide variety of low and high frequency applications.

The present invention is carried out in one illustrative form thereof in a tunnel diode comprising a planar insulating member having a pair of opposed sides, a pair of planar semiconductor pellets of one and the opposite conductivity type, one of said pellets having one face thereof securely bonded to one side of said member and the other of said pellets having one face thereof securely bonded to the other side of said member and a quantity of activator material of one conductivity-inducing type fused to said member and said wafers.

The features of the invention which are believed to be novel are set forth with particularity in the appended claims. The invention itself, however, both as to its organization and method of operation, together with further objects and advantages thereof, may best be understood by reference to the following description taken in accordance with the accompanying drawings, in which:

Figure 1:
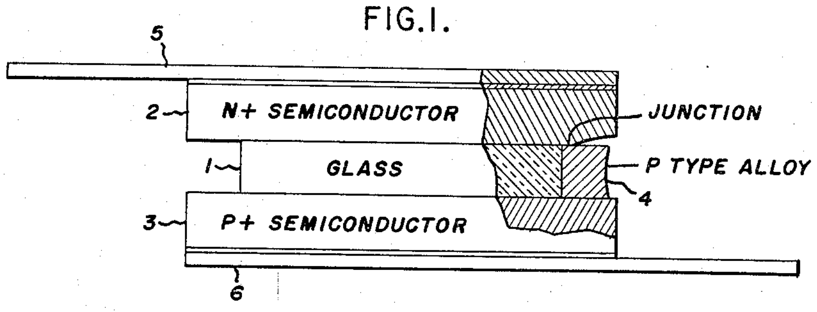
FIGURE 1 shows a sectional view of one of the devices in accordance with the present invention.
Figure 2:
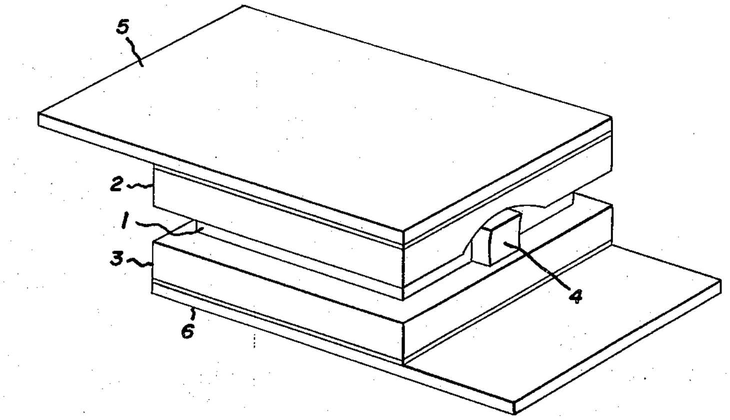
FIGURE 2 shows a perspective view of the device of FIGURE 1.

Referring now to FIGURES 1 and 2, there is shown a tunnel diode device comprising a planar insulating member 1, a pair of planar pellets 2 and 3 having edges overlapping the edge of the insulating member, and a quantity 4 of activator material. The insulating member 1 is illustratively shown as sheet glass. The planar pellet 2 is illustratively shown as heavily doped N-type conductivity germanium semiconductor material having a face securely bonded to one side of the insulating member 1. The planar pellet 3 is illustratively shown as heavily doped p-type conductivity germanium semiconductor material having a face securely bonded to the other side of the insulating member 1. The quantity 4 of activator material, illustratively shown as inducing P-type conductivity, for example, an alloy of indium and gallium (99% indium, 1% gallium), is fused to the pellets 2 and 3 and the insulating member 1 to form a tunnel junction with N-type pellet 2 and ohmic contact with P-type pellet 3. A portion of the pellet 2 is etched away to reduce it to the size of the junction to correct proportions, as desired. A conductive lead 5 is soldered to one of the pellets and another conductive lead 6 is soldered to the other of the pellets.

The individual planar sandwich structures for formation of individual devices are obtained from a large laminated structure or sandwich of these materials. One laminate may consist of a wafer of very heavily doped N-type germanium. Another laminate consists of a wafer of very heavily doped p-type germanium. The wafers are lapped and polished or etched to control thickness, for example, seven mils thickness (one mil is one-thousandth of an inch). Sheet glass is preferred as the planar insulating member because it has superior wetting properties and its composition and thickness can be controlled. With laminar glass, layers can be held to a thickness of three mils with a tolerance of ±0.5 mils. The glass is selected to have a thermal coefficient of expansion close to that of semiconductors so as to minimize cracking in structure. The laminated structure is formed by the assembling of the sheet glass laminate between the semiconductor wafers or laminates and heating to a specified temperature for a specified time, for example, 900° C. for 20 minutes, to cause the glass to melt and fuse to the wafers. The melting temperature of the glass should be less than the melting temperature of the germanium wafers. The glass should be selected to have a working temperature between 50° and 100° C. below the melting temperature of the semiconductor elements. Also, in order to minimize capacitance effects, the dielectric constant and the conductivity of the glass should be selected as low as possible consistent with the requirements of wetting, thermal expansion and low working temperatures. Borosilicate 7056 glass, a glass made and sold commercially by the Corning Glass Works of Corning, N.Y., under the aforementioned name, Borosilicate 7056 glass, has been found to meet all these requirements satisfactorily. Further information on this glass is included in their brochure B–3 entitled, "Properties of Selected Commrcial Glasses," copyrighted 1961. It will be understood that any material that meets these requirements would be suitable.

As described above, the wafer sandwiches are then either sawed or scribed and broken or etched to ultimate individual device sandwiches. A useful size has been found to be 20 x 20 x 15 mils. With a one-inch diameter wafer, about 500 to 1000 units can be formed simultaneously in the dicing operation described. The notches formed in the glass sandwich as shown in FIGURE 1 are formed by undercutting or etching the glass, leaving the semiconductor wafer overlapping the glass. For example, hydrofluoric acid will batch etch Corning Borosilicate 7056 glass selectively from N+ or P+ germanium sandwiches without significantly affecting the germanium. One advantage of notching lies in the exposure of predetermined orientation planes (such as <111> or <100> planes of semiconductor wafers so cut) for subsequent good alloy junction formation.

To assemble the device of FIGURES 1 and 2, an individual planar sandwich as formed above is placed over a suitable solder preform, for example, in connection with P-type material a gold-germanium (by weight 88% gold, 12% germanium) or gold-gallium eutectic preform would be suitable, and a lead, for example, of gold-plated fernico or Kovar (fernico and Kovar are well-known alloys consisting of iron, nickel and cobalt and having a linear coefficient of expansion similar to that of glass). On top of the sandwich is placed another preform, for example, of gold-antimony (by weight 95% gold, 5% antimony) or gold-germanium (by weight 88% gold, 12% germanium) material for N-type material, and another gold-plated fernico or Kovar lead. A quantity of activator material commonly referred to as an alloy-dot is placed in the notch or recess between the N-type pellet and the P-type pellet, engaging all elements of the sandwich. For the structure shown, an indium-gallium alloy as mentioned above was used.

The assembly of elements are then heated to 500–600° C. for a suitable time, for example, ten seconds, to cause a simultaneous alloying of the dot to the semiconductor materials and the glass plate and to cause the leads to be securely bonded to the semiconductor materials. With an indium-gallium dot, a tunnel junction is made with the N-type pellet and an ohmic contact is made with a P-type pellet. The tunnel junction is then electrolytically or chemically etched in an appropriate electrolyte such as a sodium hydroxide solution to reduce the junction area to sufficient size to produce the characteristics described in a manner well known in the art. The sandwich may then be potted, if desired, for additional mechanical strength and protection or otherwise hermetically sealed.

It will be appreciated that while specific materials were mentioned in connection with the device of FIGURES 1 and 2, these were mentioned in an exemplary sense. Other semiconductor materials, for example, silicon and various compound semiconductors such as gallium arsenide, could be used. Other insulating materials, for example, various insulating oxides such as semi-insulating zinc oxide, could be used. A variety of alloy-dot materials could be used, for example, silver-gallium (by weight 93% silver, 7% gallium) or tin-lead-gallium (by weight 49.5% tin, 49.5% lead, 1% gallium). Should it be desired to make a tunnel junction with the P+ wafer, an alloy such as tin-arsenic (by weight 99% tin, 1% arsenic) or lead-arsenic (by weight 99% lead, 1% arsenic) would have been suitable. Also, if desired, the glass plate could have remained unetched and the alloy contact made to the edge of the sandwich.

Figure 3:
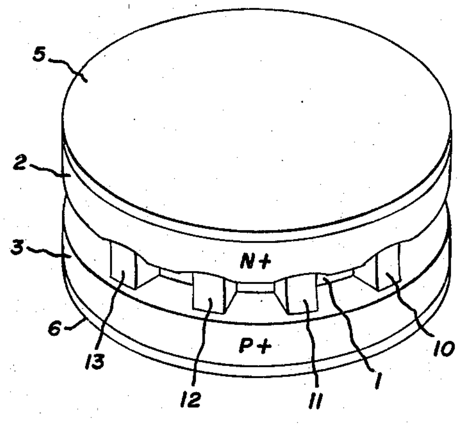
FIGURE 3 shows a perspective view of another embodiment of the present invention in which a plurality of diodes are incorporated in one planar sandwich structure.
Figure 4:
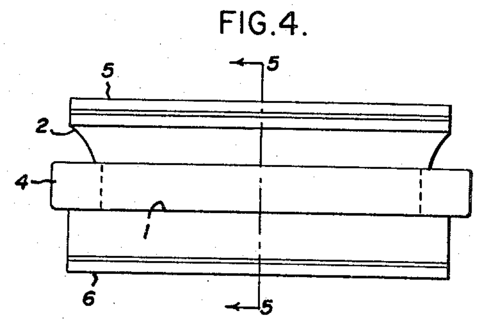
FIGURE 4 shows a side view of another embodiment of the present invention in which a continuous strip of alloy material is fused in the recess thereof to provide an annular junction.
Figure 5:
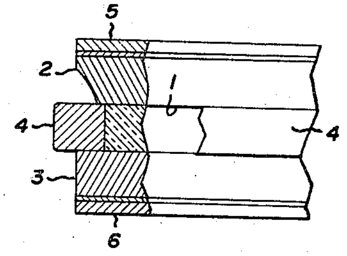
FIGURE 5 shows a sectional view of the device of FIGURE 4 taken along section 5—5.

Referring now to FIGURE 3, there is shown a perspective view of a semiconductor device in which a plurality of diodes are arrayed around the periphery of the laminated structure. The parts of the device of FIGURE 3 corresponding to the parts of the device of FIGURE 1 are indicated by the same reference numerals applied in FIGURES 1 and 2. The materials and the methods of fabrication of such a device are essentially identical to the materials and methods of fabricating the device of FIGURES 1 and 2, with the exception of the plurality of alloy dots indicated as 10, 11, 12 and 13. The device of FIGURE 3 is suitable for applications where high current carrying requirements exist. The device of FIGURE 3 has low series resistance and low thermal resistance as well.

Where distributed parameters are desired in the device, a structure such as shown in FIGURES 4 and 5 can be used. The device of these figures is similar to the device of FIGURE 3 except that the activator material is continuously distributed around the periphery of the structure. The materials and the methods of fabrication of such a device are essentially identical to the materials and methods of fabrication of the device of FIGURES 1 and 2. Corresponding parts of the device of FIGURES 4 and 5 are indicated by the same reference numerals.

Figure 6:
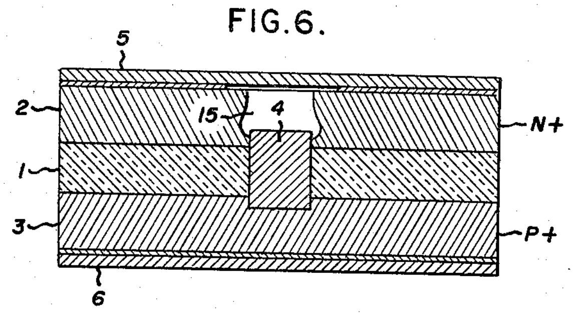
FIGURE 6 shows another embodiment of the present invention with provision for hermetically sealing the active portions of the device.

In FIGURE 6 is shown another embodiment of the invention in which the P-N junction of the device is hermetically sealed. This device is fabricated essentially of the same materials and in the same way as the device of FIGURES 1 and 2, and corresponding parts are designated by the same reference numerals. However, to locate alloy activator material 4 to permit hermetic sealing, modification of the process is necessary. After assembling the sandwich structure as in the device of FIGURES 1 and 2, a hole 15 is drilled, for example, by ultrasonically cutting, through one of the semiconductor pellets 2 through the glass insulating member 1 to the other semiconductor pellet 3. A mass of activator material 4 of appropriate conductivity type is inserted into the bore and fused to the planar glass member and to the semiconductor wafers. The device is then etched in the same way as the device of FIGURE 1 and subsequently conductive plates 5 and 6 are secured to the N+ and P+ wafers to provide contacts to these layers and at the same time to hermetically seal in the P-N junction of the device.

Figure 7:
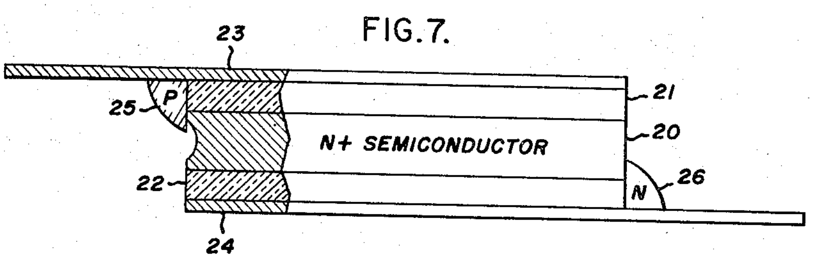
FIGURE 7 shows another embodiment of the present invention in which a planar pellet of semiconductor material is utilized and a pair of insulating support members are bonded thereto.

In FIGURE 7 is shown another embodiment of the present invention in which a single semiconductor planar pellet 20 is sandwiched between a pair of planar insulating members 21 and 22, illustratively shown as a glass plate. The individual planar sandwich of the device is fabricated in essentially the same way as the planar sandwich of the device of FIGURES 1 and 2. The glass may be etched or not, to provide a recess or notch therein as desired. A lead 23 is placed in contact with member 21 and another lead 24 is placed in contact with member 22. A quantity of activator material 25, shown as inducing p-type conductivity, is placed in contact with the edges of members 20 and 21 and with lead 23. Another quantity of activator material 26, shown as inducing N-type conductivity, is placed in contact with the edges of members 20 and 22 and with lead 24. The leads 23 and 24 are fused to members 21 and 22 and the activator materials 25 and 26 in one fusing operation similarly as the device of FIGURES 1 and 2. The device is etched to desired characteristics as with the device of FIGURES 1 and 2.

Figure 8:
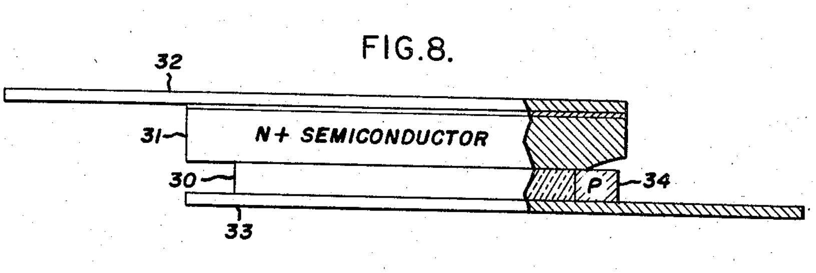
FIGURE 8 shows a further embodiment of the present invention in which the sandwich structure consists of a planar pellet and a planar insulating member.

FIGURE 8 shows another embodiment of the present invention making use of a two-layer sandwich structure consisting of an insulating member 30 and a planar pellet 31 of semiconductor material of N-type conductivity. The individual sandwich structure may be formed in the same way as the structure of FIGURE 1 is formed. The leads 32 and 33 and a quantity 34 of activator material of p-type conductivity are then put in position and fused in one fusing operation to form the junction and to provide electrical contacts bonded to the glass and the semiconductor. The junction of the device is then etched to size as desired.

Devices made in accordance with the present invention are not only extremely rugged but are simple in construction, and are easily and inexpensively made. In addition, the devices provided have lower inductances and capacitances, and lower series resistances and thermal resistances than conventional devices, making them suitable for a wide variety of low and high frequency applications.

While specific embodiments have been shown and described, it will, of course, be understood that various modifications may yet be devised by those skilled in the art which will embody the principles of the invention and be found in the true spirit and scope thereof.

What we claim as new and desire to secure by Letters Patent of the United States is:

1. A semiconductor tunnel diode device comprising a planar insulating member having a pair of opposed sides, a pair of planar semiconductor pellets of one and the opposite conductivity type, one of said pellets of one conductivity type having one face thereof securely bonded to one side of said member, the other of said pellets of opposite conductivity type having the other face thereof securely bonded to the other side of said member, a bore extending from one face of said one pellet through said one pellet and said member and to a partial depth into said other pellet, a quantity of activator material of the opposite conductivity inducing type fused to said member and to said pellets in said bore and forming a small area PN junction with said one pellet in a portion of said bore therethrough, means for sealing said bore, and means for making electrical connection to the other sides of said pellets.

2. In a semiconductor tunnel diode device, a planar pellet of one conductivity type, a pair of planar insulating members each having a pair of opposed sides, one side of one of said members securely bonded to one face of said pellet, one side of the other of said members securely bonded to the other face of said pellet, a quantity of one activator material of one conductivity inducing type fused to a portion of the surface of said pellet exposed between said insulating members and fused to one of said insulating members, another quantity of another activator material of the opposite conductivity inducing type fused to a portion of the surface of said pellet exposed between said insulating members and fused to said other insulating member, the area of contact of said other activator material to said pellet forming a small area PN junction between said other activator material and said pellet, and means for making respective electrical contacts to said respective quantities of activator material.

3. In a semiconductor tunnel diode device, a planar pellet of one conductivity type, a pair of planar insulating glass members each having a pair of opposed sides, one side of one of said members securely bonded to one face of said pellet, one side of the other of said members securely bonded to the other face of said pellet, a quantity of one activator material of one conductivity inducing type fused to a portion of the surface of said pellet exposed between said glass members and fused to one of said members, another quantity of another activator material of the opposite conductivity inducing type fused to said other member and to a portion of the surface of said pellet exposed between said members, said another quantity being spaced from said one activator material and contacting said pellet to form a small area PN junction therewith, a conductor secured to said one member and said one quantity of activator material, and another conductor secured to said other member and said other quantity of activator material.

References Cited

UNITED STATES PATENTS 3,160,534 12/1964 Oroshnik ---------- 317—235
3,179,542 4/1965 Quinn et al. ---------- 317—235
3,248,614 4/1966 Rutz ---------- 317—234

JOHN W. HUCKERT, *Primary Examiner.*

J. D. CRAIG, *Assistant Examiner.*